United States Patent [19]

Terada et al.

[11] Patent Number: 5,451,904
[45] Date of Patent: Sep. 19, 1995

[54] AMPLIFYING CIRCUIT IN WHICH VARIABLE IMPEDANCE CIRCUIT IS USED IN NEGATIVE FEEDBACK CIRCUIT

[75] Inventors: Yukihiro Terada; Kyozo Makime; Hideaki Adachi, all of Kanagawa, Japan

[73] Assignee: Mitsumi Electric Co., Ltd., Tokyo, Japan

[21] Appl. No.: 218,510

[22] Filed: Mar. 25, 1994

[30] Foreign Application Priority Data

Mar. 26, 1993 [JP] Japan .................................. 5-068521
Mar. 2, 1994 [JP] Japan .................................. 6-032572

[51] Int. Cl.⁶ ............................................. H03G 3/30
[52] U.S. Cl. ........................................ 330/282; 330/86
[58] Field of Search ............... 330/86, 110, 282, 293, 330/294

[56] References Cited

U.S. PATENT DOCUMENTS

| | | | |
|---|---|---|---|
| 4,471,324 | 9/1984 | Welland | 330/282 |
| 4,868,516 | 9/1989 | Henderson et al. | 330/86 |
| 5,291,151 | 3/1994 | Fujiwara et al. | 330/282 |

*Primary Examiner*—Steven Mottola
*Attorney, Agent, or Firm*—Ladas & Parry

[57] ABSTRACT

An amplifying circuit includes: amplifying device for amplifying an input signal and outputting the amplified signal; feedback device for feeding the output signal from the amplifying device back to an input terminal of the amplifying device so that the output signal may have a predetermined frequency characteristic; and a variable impedance circuit which, included in the feedback device, operates on the basis of a current from a current source, and which has its impedance altered in accordance with the current.

6 Claims, 6 Drawing Sheets

AMPLIFYING CIRCUIT IN WHICH VARIABLE IMPEDANCE CIRCUIT IS USED IN NEGATIVE FEEDBACK CIRCUIT

BACKGROUND OF THE INVENTION

The present invention relates to amplifying circuits and more particularly to an amplifying circuit in which the gain in the predetermined frequency band is variable.

FIG. 1 shows a circuit diagram of a conventional amplifying circuit. An amplifying circuit 20 shown in FIG. 1 is configured such that the gain in the low frequency band is variable, and is used, for example, as an amplifying circuit for amplifying reproduced audio signals in a stereo headphone.

An amplifier 21 of FIG. 1 has a frequency characteristic as shown in FIG. 2A where the voltage gain $A_{V1}$ drops beyond a low cut-off frequency $f_L$ determined by a resistance $R_4$ and a capacitor $C_2$. The output voltage of the amplifier 21 is fed to the input of a summing amplifier 22 via a variable resistor $R_5$.

The voltage gain $A_{V2}$ of the amplifier 23 has a flat frequency characteristic extending into the high-frequency range, as shown in FIG. 2B. The output voltage of the amplifier 23 is fed to the input of the summing amplifier 22 and added to the output voltage of the amplifier 21.

Thus, the frequency characteristic of an output voltage $V_{OUT}$ from the amplifier 22 obtained at an output terminal 24 is as shown in FIG. 2C. That is, the amount of boosting of the output voltage gain in the low-frequency band can be adjusted as indicated by an arrow A in FIG. 2C by adjusting the variable resistor $R_5$. In this way, the circuit of FIG. 1 enables an audio effect to be adjusted so as to be suitable for the user's taste and the type of music source.

However, the above-mentioned amplifying circuit 20 has a problem in that, when the amount of boosting of the output voltage gain in the low-frequency band is altered, a medium cut-off frequency (a cut-off frequency in the intermediate frequency band) $F_M$ is also altered as indicated by an arrow F in FIG. 2C, thereby causing an unfavorable audio effect. Another problem with the conventional circuit of FIG. 1 is that there are a comparatively large number of amplifiers required, thus adding a substantial expense to the circuit.

SUMMARY OF THE INVENTION

Accordingly, a general object of the present invention is to provide a low-cost amplifying circuit in which the aforementioned problems with the conventional technology are resolved, and the cut-off frequency is not altered even when the gain in the predetermined frequency band is altered.

Another and more specific object of the present invention is to provide an amplifying circuit comprising: amplifying means for amplifying an input signal and outputting the amplified signal; feedback means for feeding the output signal from the amplifying means back to an input terminal of the amplifying means so that the output signal may have a predetermined frequency characteristic; and a variable impedance circuit which, included in the feedback means, operates on the basis of a current from a current source, and which has its impedance altered in accordance with the current.

Still another object of the present invention is to provide an amplifying circuit comprising: amplifying means for amplifying an input signal and outputting the amplified signal; feedback means for feeding the output signal from the amplifying means back to an input terminal of the amplifying means so that the output signal may have a predetermined frequency characteristic; and a variable impedance circuit which, included in the feedback means, senses the voltage at a predetermined location in the feedback means, and feeds back, to a predetermined location in the feedback means other than the location of sensing, a current corresponding to the sensed voltage and corresponding to a current from a built-in current source.

According to the present invention, the feedback means includes the variable impedance circuit which operates on the basis of a current supplied from a current source and which has its impedance altered in accordance with the current so that the output signal from the amplifying means has a predetermined frequency characteristic. Thus, it is possible to obtain a desired frequency characteristic of the output signal in accordance with the impedance of the variable impedance circuit by setting the level of the current from the current source, without requiring a large number of amplifiers. Furthermore, the cut-off frequency does not change with the variation of the frequency characteristic.

Since it is possible to adjust the equivalent impedance with respect to the location to which the current is fed back by altering the level of the current from the current source in the variable impedance circuit, the frequency characteristic of the output signal in a predetermined frequency band can be adjusted by setting the level of the current from the current source accordingly. Also, the cut-off frequency, marking the end of the frequency band in which the frequency characteristic is altered and the beginning of the frequency band in which the frequency characteristic is flat, can remain unaltered. To this end, there is no need for a large number of amplifiers. Hence, the reduction of the cost is achieved. The configuration in which the current is fed back to a location which is different from the location at which the voltage is sensed ensures that the frequency characteristic near the cut-off frequency is improved.

DESCRIPTION OF THE PREFERRED EMBODIMENTS

A description will now be given of a first embodiment of the present invention, with reference to the drawings.

Figure 3:
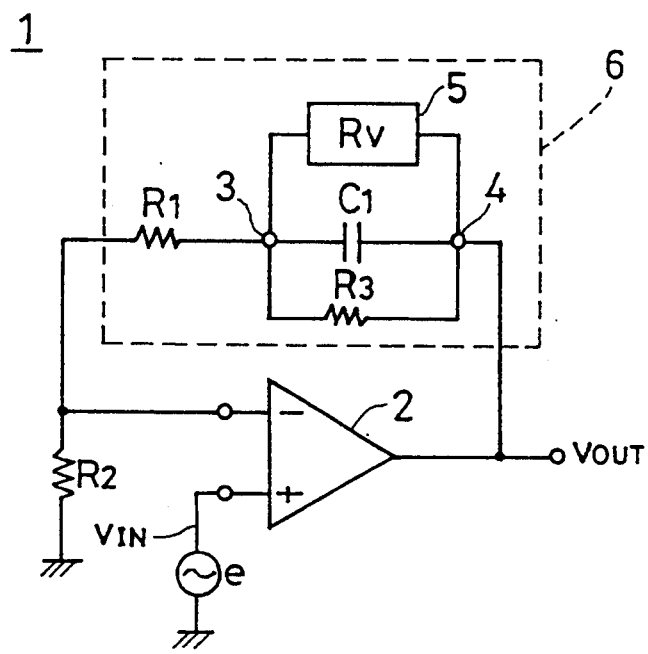
FIG. 3 is a circuit diagram of a first embodiment of the present invention.

FIG. 3 is a circuit diagram of a first embodiment of the present invention showing an amplifying circuit 1 configured such that the amount of boosting of the gain in the low-frequency band is variable.

Referring to FIG. 3, an input signal $V_{IN}$ from a signal source e arrives at the noninverting input of a differential amplifier 2 embodying an amplifying means. The inverting input of the differential amplifier 2 is grounded via a resistance $R_2$. As shown in the figure, a feedback circuit 6 embodying a feedback means is connected between the noninverting input and the output terminal of the differential amplifier 2.

The feedback circuit 6 is configured such that a parallel circuit including a resistance $R_3$, a capacitor $C_1$ and a variable impedance circuit 5 is in series connection with a resistance $R_1$. The parallel circuit is provided between a terminal 3 and a terminal 4. The variable impedance circuit 5 has a variable impedance $R_V$.

It is known that the voltage gain $A_V$ of the amplifying circuit 1 is given by the following equation.

$$A_V = 20 \log \frac{R_1 + R_2 + \frac{R_3 R_V}{R_3 + R_V}}{R_2} \quad (1)$$

Figure 4:
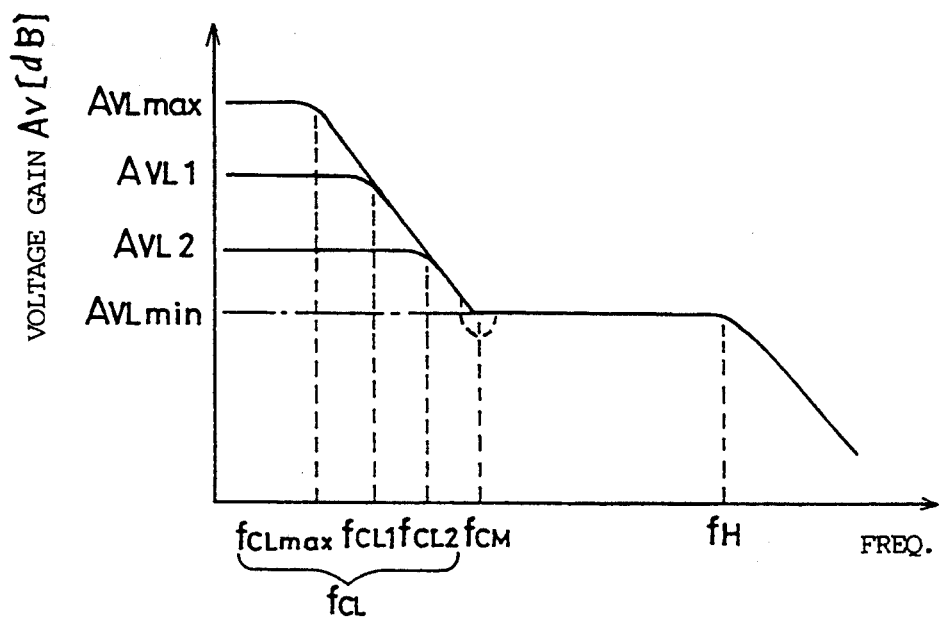
FIG. 4 is a representation of the frequency characteristic of the amplifying circuit of FIG. 3.

As shown in FIG. 4, the voltage gain $A_V$, i.e. $V_{OUT}/V_{IN}$, is boosted in the low-frequency band, exhibits a flat characteristic in the medium-frequency band, and drops in the high-frequency band beyond $f_H$.

The medium cut-off frequency $f_{CM}$ is substantially determined by the time constant of the series circuit consisting of the capacitor $C_1$ and the resistance $R_1$ and is given by $$f_{CM} \approx \frac{1}{2\pi C_1 R_1} \quad (2)$$

The low cut-off frequency $f_{CL}$ is substantially determined by the time constant of the parallel circuit consisting of a capacitor $C_1$, the resistance $R_3$ and the variable impedance circuit 5 and is given by $$f_{CL} \approx \frac{1}{2\pi C_1 \frac{R_3 R_V}{R_2 + R_V}} \quad (3)$$

Thus, it is possible to alter the low cut-off frequency $f_{CL}$ as indicated by $f_{CLmax}$, $f_{CL1}$ and $f_{CL2}$ in the figure, by adjusting the impedance $R_V$ of the variable impedance circuit 5 while maintaining the medium cut-off frequency $f_{CM}$ at a constant value as given by the equation (2).

The voltage gain $A_V$ is also altered in accordance with the impedance $R_V$ of the variable impedance circuit 5 as is evident from the equation (1). In this way, the amount of boosting of the output voltage gain in the low-frequency band is variable.

The voltage gain in the low-frequency band is altered as indicated by $A_{VL1}$, $A_{VL2}$ etc. in the figure. The maximum voltage gain $A_{Vmax}$ in the low-frequency band is given by the following equation derived from the equation (1), by arranging the impedance $A_V$ of the variable impedance circuit 5 to be significantly larger than the value of the resistance $R_3$.

$$A_{VLmax} = 20 \log \frac{R_1 + R_2 + R_3}{R_2} \quad (4)$$

Letting, in the equation (3), $R_V$ be an infinity, the low cut-off frequency $f_{CLmax}$ is given by the following equation.

$$f_{CLmax} = \frac{1}{2\pi C_1 R_3} \quad (5)$$

The minimum voltage gain in the low-frequency band is given by the following equation obtained by letting, in the equation (1), the impedance $R_V$ of the variable impedance circuit 5 be zero.

$$A_{VLmin} = 20 \log \frac{R_1 + R_2}{R_2} \quad (6)$$

This value $A_{VLmin}$ is identical to the voltage gain in the range where the frequency characteristic is flat. The voltage gain in the range beyond the frequency $f_H$ is determined by the open loop gain of the amplifier 2.

Figure 5:
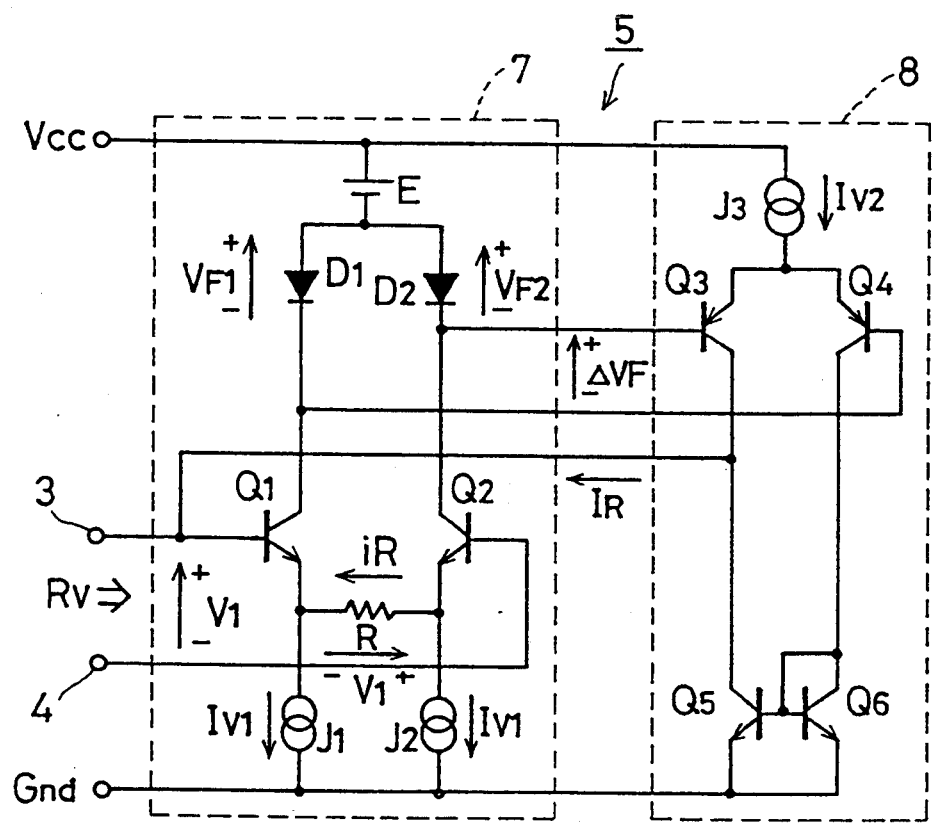
FIG. 5 is a detailed circuit diagram of a variable impedance circuit of FIG. 3.

A description of the detailed construction of the variable impedance circuit 5 is given with reference to FIG. 5. Referring to FIG. 5, the variable impedance circuit 5 is provided between the terminals 3 and 4.

The variable impedance circuit 5 is comprised of a variable impedance part 7 and a V-I (voltage-ampere) converting part 8. The terminals 3 and 4 are connected to the variable impedance part 7. The impedance $R_V$ between the terminals 3 and 4 is configured to be variable as will be described later.

The variable impedance part 7 includes: a transistor $Q_1$ having its base connected to the terminal 3; a transistor $Q_2$ having its base connected to the terminal 4; a voltage sensing resistance R connected between the emitters of the transistors $Q_1$ and $Q_2$; a current source $J_1$ connected between the emitter of the transistor $Q_1$ and the ground; a current source $J_2$ connected between the emitter of the transistor $Q_2$ and the ground; a diode $D_1$ having its anode connected to the anode of a diode $D_2$ to form a common anode and having its cathode connected to the collector of the transistor $Q_1$; the diode $D_2$ having its anode connected to the anode of the diode $D_1$ to form the common anode and having its cathode connected to the collector of the transistor $Q_2$; and a voltage source E connected between the common anode shared by the diodes $D_1$ and $D_2$ and a power source terminal $V_{CC}$. The current source $J_1$ and the current source $J_2$ are of the same configuration, each of the current sources $J_1$ and $J_2$ supplying a current $I_{V1}$.

The V-I converting part 8 includes transistors $Q_3$ and $Q_4$ having their emitters connected to each other to form a common emitter; a current source $J_3$ connected between the common emitter shared by the transistors $Q_3$ and $Q_4$ and a power source terminal $V_{CC}$; a transistor $Q_5$ serving as a collector load of the transistor $Q_3$; and a transistor $Q_6$ serving as a collector load of the transistor $Q_4$. The transistors $Q_5$ and $Q_6$ are connected in a current mirror arrangement. The current source $J_3$ supplies a current $I_{V2}$.

The V-I converting part 8 has a known configuration in which the base of the transistor $Q_3$ is connected to the cathode of the diode $D_2$ and the base of the transistor $Q_4$ is connected to the cathode of the diode $D_1$, and a current $I_R$ is drawn from the collector of the transistor $Q_5$ in correspondence with the voltage $\Delta VF$ supplied between the base of the transistor $Q_3$ and the base of the transistor $Q_4$.

Ensuring that the transistors $Q_1$ and $Q_2$ have substantially the same base-emitter forward-direction drop characteristic, and providing that the current flowing through the resistance R is iR and the voltage across the resistance R is $V_1$, we obtain $$iR = \frac{V_1}{R} \qquad (7)$$

The voltage difference $\Delta VF$ between the forward-direction voltage drop $V_{F1}$ of the diode $D_1$ and the forward-direction voltage drop $V_{F2}$ of the diode $D_2$ is $$\Delta VF = \frac{kT}{q} \ln \frac{I_{V1} + iR}{I_{V1} - iR} \qquad (8)$$

where T denotes an operating temperature [K], k denotes the Boltzmann constant ($1.380662 \times 10^{-23}$ [JK$^{-1}$]), and q denotes the electrical charge of an electron ($1.6021892 \times 10^{-19}$ [c]).

The transistors $Q_3$ and $Q_4$ of the V-I converting part 8 have the same characteristic. The transistors $Q_5$ and $Q_6$ also have the same characteristic. As a result of the V-I conversion, $$\Delta VF = \frac{kT}{q} \ln \frac{\frac{I_{V2}}{2} + \frac{I_R}{2}}{\frac{I_{V2}}{2} - \frac{I_R}{2}} \qquad (9)$$

$$\therefore \Delta VF = \frac{kT}{q} \ln \frac{I_{V2} + I_R}{I_{V2} - I_R} \qquad (10)$$

It follows from the equations (8) and (10) that $$\frac{I_{V1} + iR}{I_{V1} - iR} = \frac{I_{V2} + I_R}{I_{V2} - I_R} \qquad (11)$$

Expanding the equation (11), we obtain $$I_{V2}(I_{V1} + iR) - I_R(I_{V1} + iR) = I_{V2}(I_{V1} - iR) + I_R(I_{V1} - iR) \qquad (12)$$

Accordingly, the current $I_R$ in correspondence with the voltage $\Delta VF$ supplied from the V-I converting part 8 to the variable impedance part 7 is $$I_R = \frac{I_{V2} \times 2iR}{2I_{V1}} \qquad (13)$$

$$\therefore I_R = \frac{I_{V2}}{I_{V1}} \times iR \qquad (14)$$

The current $I_R$ is fed back to the terminal 3 as indicated in FIG. 5. Inserting the value of iR given by the equation (7) into the equation (14), $$I_R = \frac{I_{V2}}{I_{V1}} \times \frac{V_1}{R} \qquad (15)$$

$$\therefore \frac{V_1}{I_R} = R \times \frac{I_{V1}}{I_{V2}} \qquad (16)$$

The above equation (16) signifies that the equivalent impedance $R_V$ indicated by the right side ($R(I_{V1}/I_{V2})$) of the equation (16) is connected between the terminals 3 and 4. Since the value of the resistance R is constant, the equivalent impedance $R_V$ between the terminals 3 and 4 of the variable impedance part 7 can be adjusted by altering the current ratio ($I_{V1}/I_{V2}$) that exists between the current source $J_1$ ($J_2$) and the current source $J_3$.

As described above, this embodiment allows the voltage between the terminals 3 and 4 in the feedback circuit 6 of the differential amplifier 2 of FIG. 3 to be sensed by the resistance R of FIG. 5 so that the impedance of the variable impedance part 7 can be adjusted. Such an arrangement of this embodiment results in a circuit configuration more simplified than the conventional circuit. Since only one amplifier is required and no summing amplifier is required, it is possible to build the circuit at a reduced cost.

Since, as has been mentioned before, the medium cut-off frequency is controlled to be constant even when the amount of boosting of the gain in the low-frequency band is altered, no unfavorable audio effect results, and the audio effect can be adjusted so as to be suitable to the user's taste and the type of music source.

The constitution of the variable impedance circuit 5 of this embodiment may be applied to filter circuits such as a high-pass filter circuit, a low-pass filter circuit or a band-pass filter circuit, so that only the gain in a target frequency band can be adjusted without affecting the overall desired frequency characteristic of the filter circuit.

However, when the voltage gain $A_{VL}$ in the low-frequency band is set to be relatively large in the amplifying circuit 1 shown in FIG. 3, there occurs a minor distortion in the voltage gain in the neighborhood of the medium cut-off $f_{CM}$, as indicated by a broken line in FIG. 4.

The amplifying circuit of a second embodiment described below resolves this inconvenience so that an even better frequency characteristic is obtained.

Figure 6:
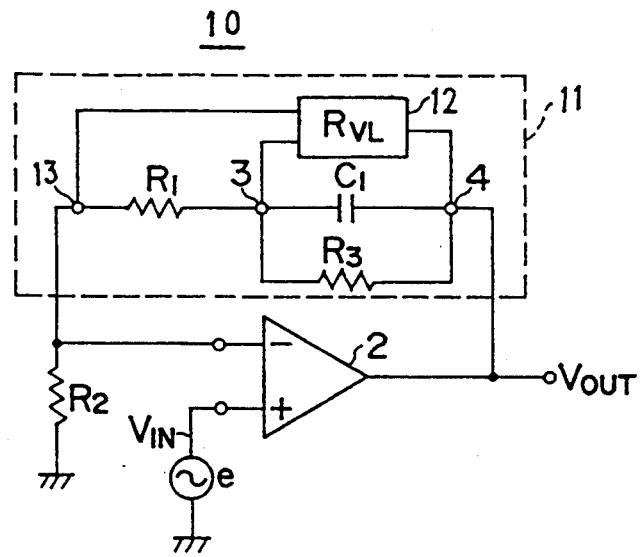
FIG. 6 is a circuit diagram of a second embodiment of the present invention.

FIG. 6 is a circuit diagram of a second embodiment of the present invention showing an amplifying circuit 10 in which the amount of boosting of the gain in the low-frequency band can be adjusted. In FIG. 6, those parts that are the same as the parts of FIG. 3 are designated by the same reference numerals.

Referring to FIG. 6, an input signal $V_{IN}$ from the signal source e is fed to the noninverting input of a differential amplifier 2, and the inverting input thereof is grounded via the resistance $R_2$. As shown in FIG. 6, a feedback circuit 11 is provided between the inverting input and the output terminal.

The feedback circuit 11 is configured such that a variable impedance circuit 12 is connected to a series combination of the resistance $R_1$ and a parallel circuit formed by the resistance $R_3$ and the capacitor $C_1$. The variable impedance circuit 12 is a circuit for sensing the voltage between the terminals 3 and 4 and for feeding a current proportional to the sensed voltage back to a terminal 13. The equivalent impedance between the terminals 13 and 4 is adjustable by adjusting the proportion of the current that is fed back with respect to the sensed voltage.

Figure 7:
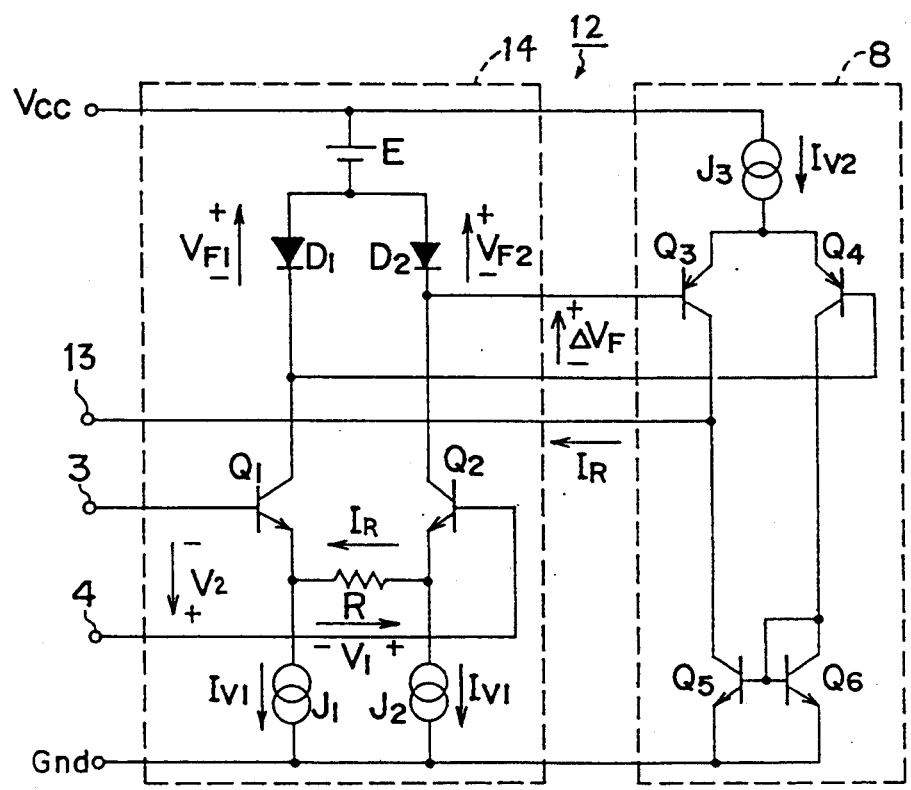
FIG. 7 is a detailed circuit diagram of a variable impedance circuit of FIG. 6.

FIG. 7 shows a detailed construction of the variable impedance circuit 12. In FIG. 7 those parts that are the same as the parts of FIG. 5 are designated by the same reference numerals.

The variable impedance circuit 12 is generally comprised of a voltage sensing part 14 and the V-I converting part 8. The terminals 3 and 4 shown in FIG. 6 are connected to input terminals of the voltage sensing part 14.

The voltage sensing part 14 has substantially the same configuration as the aforementioned variable impedance part 7. The only difference between the voltage sensing part 14 and the variable impedance part 7 is that the current $I_R$ from the collector of the transistor $Q_3$ of the V-I converting part 8 is not fed back to the terminal 3. The current $I_R$ corresponding to $\Delta VF$ is given by the aforementioned equation (14), and is fed back to the terminal 13 of FIG. 6.

Ensuring that the transistors $Q_1$ and $Q_2$ have substantially the same base-emitter forward-direction drop characteristic, and providing that the current flowing through the resistance R is iR and the voltage between the terminals 3 and 4 is $V_2$, we obtain $$iR = \frac{V_2}{R} \qquad (17)$$

Inserting, in the equation (14), the value of the current iR given by the equation (17), we obtain $$I_R = \frac{I_{V2}}{I_{V1}} \times \frac{V_2}{R} \qquad (18)$$

In the circuit of FIG. 7, the voltage $V_2$ is generated between the terminals 3 and 4 in correspondence with the voltage between the terminals 13 and 4. As indicated by the above equation (18), the current $I_R$ proportional to the voltage $V_2$ is fed back to the terminal 13. Thus, the equation (18) means that the equivalent impedance $R_{VL}$ is connected between the terminals 13 and 4.

Since the value of the resistance R is constant, the equivalent impedance $R_{VL}$ can be adjusted by adjusting the feedback current $I_R$ by altering the current ratio ($I_{V1}/I_{V2}$) that exists between the current source $J_1$ ($J_2$) and the current source $J_3$.

A description will now be given of the frequency characteristic of the amplifying circuit 10 of FIG. 6 in which the above described variable impedance circuit 12 is provided in the feedback circuit 11.

Figure 8:
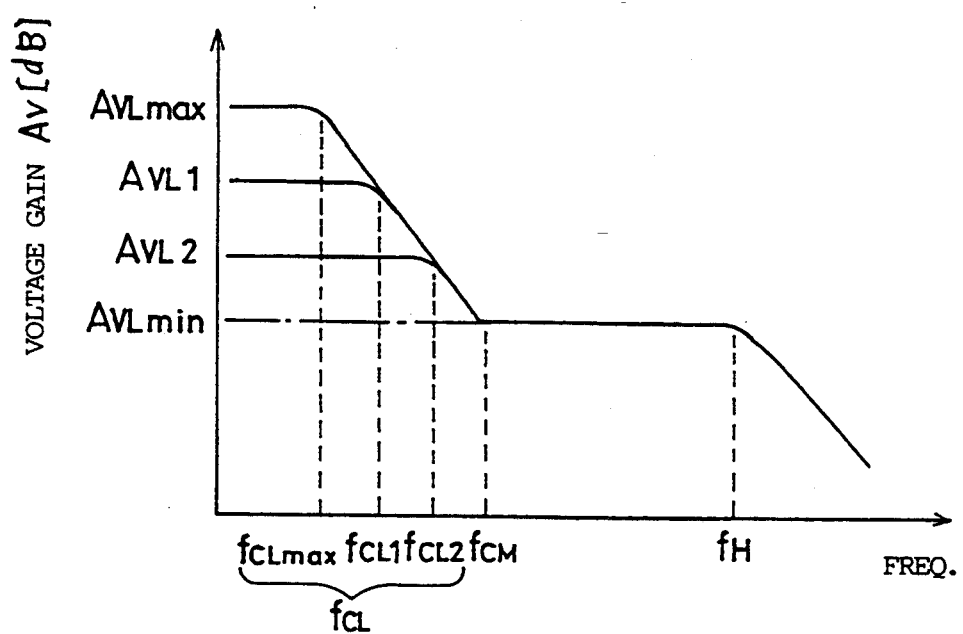
FIG. 8 is a representation of the frequency characteristic of the amplifying circuit of FIG. 6.

As shown in FIG. 8, voltage gain $A_V$ of the amplifying circuit 10 is boosted in the low-frequency band, exhibits a flat characteristic in the medium-frequency band, and drops in the high-frequency beyond $f_H$.

Providing that the equivalent impedance, in the low-frequency band, between the terminals 13 and 4 of the variable impedance circuit 12 is $R_{VL}$, the voltage gain $A_{VL}$ of the amplifying circuit 10 in the low-frequency band is given by the following equation.

$$A_{VL} = 20 \log \frac{R_2 + \frac{(R_1 + R_2)R_{VL}}{(R_1 + R_2) + R_{VL}}}{R_2} \qquad (19)$$

The medium cut-off frequency $f_{CM}$ is substantially determined by the time constant of the series circuit consisting of the capacitor $C_1$ and the resistance $R_1$, and is given by the aforementioned equation (2).

The low cut-off frequency $f_{CL}$ is substantially determined by the time constant of the parallel circuit formed by the capacitor $C_1$, the resistance $R_3$ and the equivalent impedance $R_{VL}$ of the variable impedance circuit 12, and is given by $$f_{CL} = \frac{1}{2 C_1 \frac{R_3 R_{VL}}{R_3 + R_{VL}}} \qquad (20)$$

The low cut-off frequency $f_{CL}$ can be adjusted as indicated by $F_{CLmax}$, $f_{CL1}$, $f_{CL2}$ in FIG. 8 by adjusting the equivalent impedance $R_{VL}$ of the variable impedance circuit 12 while maintaining the medium cut-off frequency $f_{CM}$ at a constant level as given by the equation (2).

As is evident from the equation (19), the voltage gain $A_{VL}$ in the low-frequency band can be adjusted in accordance with the equivalent impedance $R_{VL}$ of the variable impedance circuit 12. This way, the amount of boosting of the voltage gain in the low-frequency band can be adjusted as desired.

That is, the voltage gain can be adjusted in the low-frequency band as indicated by $A_{VL1}$, $A_{VL2}$ etc. in FIG. 8. Providing, in the equation (19), that the equivalent impedance $R_{VL}$ of the variable impedance circuit 12 is significantly larger than the resistance $R_2$, the maximum voltage gain $A_{VLmax}$ in the low-frequency band is given by $$A_{VLmax} = 20 \log \frac{R_1 + R_2 + R_3}{R_2} \qquad (21)$$

Providing, in the equation (20), that $R_{VL}$ has an infinite value, the low cut-off frequency $f_{CLmax}$ is given by the following equation, which is the same as the equation (5).

$$f_{CLmax} \approx \frac{1}{2\pi C_1 R_2} \qquad (22)$$

Adjusting the equivalent impedance $R_{VL}$ so that the impedance of a parallel circuit formed by the series circuit including the resistance $R_1$ and the resistance $R_3$ and by the variable impedance circuit 12 having the equivalent impedance of $R_{VL}$ is equal to the resistance $R_1$, the minimum voltage gain $A_{VLmin}$ in the low-frequency band is given by the following equation on the basis of the equation (19)

$$A_{VLmin} = 20 \log \frac{R_1 + R_2}{R_2} \qquad (23)$$

This voltage gain is identical to the voltage gain in the range beyond the medium cut-off frequency $f_{CM}$ where the frequency characteristic is flat.

In the frequency band beyond the medium cut-off frequency $f_{CM}$, the impedance of the capacitor $C_1$ is small, and the voltage $V_2$ between the terminals 3 and 4 is significantly smaller than the voltage between the terminals 13 and 4. Hence, the current $I_R$ supplied to the terminal 13 from the variable impedance circuit 12 is significantly small so that the equivalent impedance $R_V$ has a substantially infinite value. Accordingly, even when the equivalent impedance $R_V$ in the low-frequency band is altered, the voltage gain $A_V$ given by the equation (18) is not affected in the range beyond the medium cut-off frequency $f_{CM}$.

The voltage gain $A_V$ is determined by the gain of the amplifier 2 in the range beyond the frequency $f_H$.

Since, the circuit shown in FIG. 6 makes it possible to alter the amount of boosting of the voltage gain in the low-frequency band while maintaining the medium cut-off frequency $f_{CM}$ at a constant level, no unfavorable audio effect results, and the audio effect can be adjusted so as to be suitable to the user's taste and the type of music source.

Figure 1:
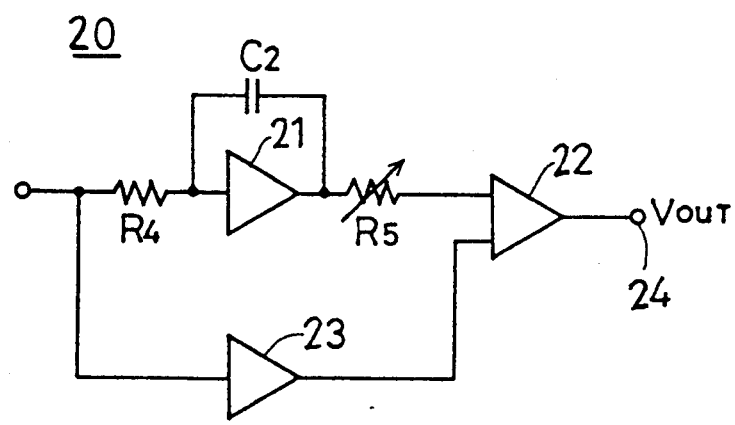
FIG. 1 is a circuit diagram of a conventional amplifying circuit.
Figure 2A:
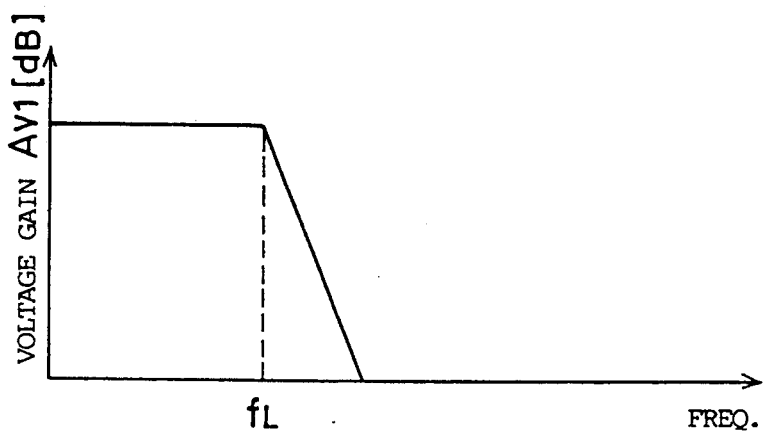
FIGS. 2A, 2B and 2C are a representation of the frequency characteristic of the amplifying circuit of FIG. 1.
Figure 2B:
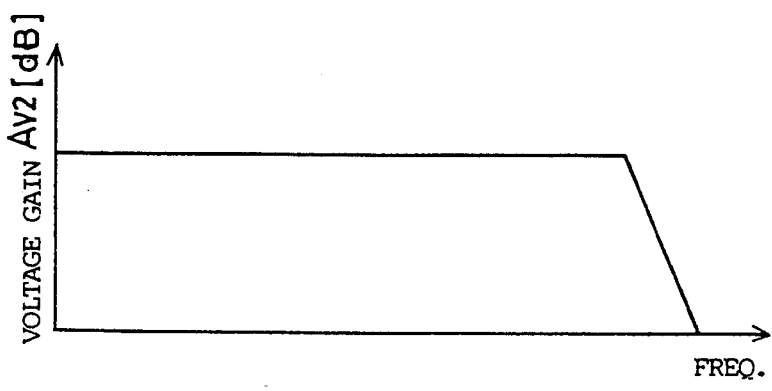
Figure 2C:
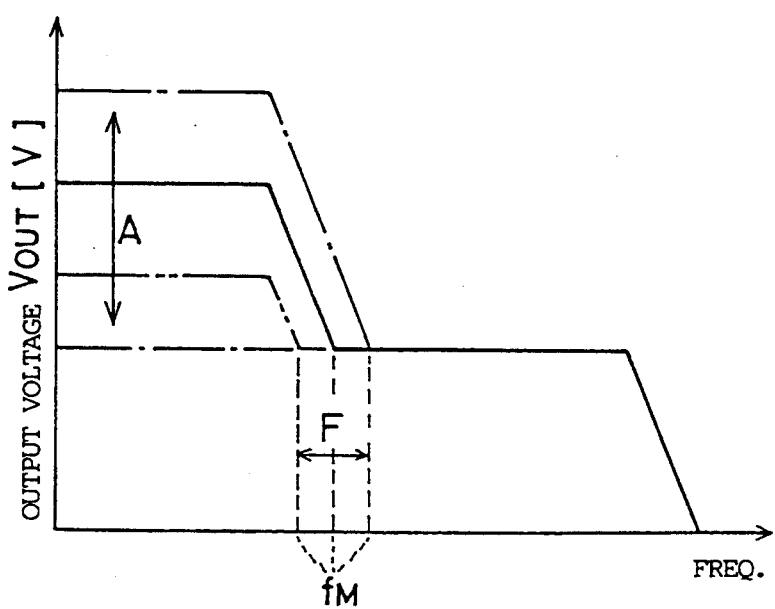

The difference between the circuit of FIG. 6 and the circuit 20 of FIG. 1 is that only one amplifier is required so that the cost is reduced.

The amplifying circuit 10 of FIG. 6 differs from the amplifying circuit 1 of FIG. 3 in that the voltage $V_2$ between the terminals 3 and 4 is sensed by the variable impedance circuit 12, and in that the current $I_R$ proportional to the sensed voltage is fed back to the terminal 13. A circuit simulation (using, for example, SPICE) carried out by the present applicant revealed that no distortion occurs in the voltage gain $A_V$ near the medium cut-off frequency $f_{CM}$ even when the voltage gain $A_{VL}$ in the low-frequency band is set to be large.

Thus, the amplifying circuit 10 of this embodiment produces a frequency characteristic even better than that produced by the amplifying circuit 1 of FIG. 3.

The constitution of the variable impedance circuit 12 of this embodiment may be applied to filter circuits such as a bypass filter circuit, a low pass filter circuit or a band pass filter circuit so that only the gain in a target frequency band can be adjusted without affecting the overall desired frequency characteristic of the filter circuit.

The present invention is not limited to the above described embodiments, and variations and modifications may be made without departing from the scope of the present invention.

What is claimed is:

1. An amplifying circuit comprising:
   amplifying means having a first input terminal connected to a signal source and having a second input terminal grounded via a first resistor, for amplifying a signal from said signal source and outputting the amplified signal; and
   feedback means which, connected between said second input terminal and an output terminal of said amplifying means, feeds the output signal from said amplifying means back to said second input terminal of said amplifying means so that said output signal may have a predetermined frequency characteristic,
   wherein said feedback means comprises:
   a series arrangement including a second resistor and a feedback capacitor;
   a third resistor coupled in parallel with said feedback capacitor; and
   a variable impedance circuit which senses the voltage across predetermined locations in said feedback means, and feeds back, to one of said predetermined locations, a current corresponding to said sensed voltage and corresponding to a current from a built-in current source.

2. The amplifying circuit as claimed in claim 1, wherein said variable impedance circuit of said feedback means comprises voltage sensing means and voltage-current converting means.

3. The amplifying circuit as claimed in claim 2, wherein said voltage sensing means of said variable impedance circuit senses the voltage difference across said feedback capacitor, and said voltage-current converting means feeds a current corresponding to the voltage supplied from said voltage sensing means to an end of said feedback capacitor.

4. An amplifying circuit comprising:
   amplifying means having a first input terminal connected to a signal source and having a second input terminal grounded via a first resistor, for amplifying a signal from said signal source and outputting the amplified signal; and
   feedback means which, connected between said second input terminal and an output terminal of said amplifying means, feeds the output signal from said amplifying means back to said second input terminal of said amplifying means so that said output signal may have a predetermined frequency characteristic,
   wherein said feedback means comprises:
   a series arrangement including a second resistor and a feedback capacitor;
   a third resistor coupled in parallel with said feedback capacitor; and
   a variable impedance circuit which senses the voltage across predetermined locations in said feedback means, and feeds back, to a predetermined location in said feedback means other than said predetermined locations of sensing, a current corresponding to said sensed voltage and corresponding to a current from a built-in current source.

5. The amplifying circuit as claimed in claim 4, wherein said variable impedance circuit of said feedback means comprises voltage sensing means and voltage-current converting means.

6. The amplifying circuit as claimed in claim 5, wherein said voltage sensing means of said variable impedance circuit senses the voltage across said feedback capacitor, and said voltage-current converting means feeds a current corresponding to the voltage supplied by said voltage sensing means back to said second input terminal of said amplifying means.

* * * * *